(12) United States Patent
Dieker

(10) Patent No.: US 6,768,600 B2
(45) Date of Patent: Jul. 27, 2004

(54) TEMPERATURE COMPENSATION APPARATUS FOR THERMALLY LOADED BODIES OF LOW THERMAL CONDUCTIVITY

(75) Inventor: Thomas Dieker, Ulm (DE)

(73) Assignee: Carl-Zeiss-Stiftung (DE)

( * ) Notice: Subject to any disclaimer, the term of this patent is extended or adjusted under 35 U.S.C. 154(b) by 85 days.

(21) Appl. No.: 09/975,920

(22) Filed: Oct. 10, 2001

(65) Prior Publication Data

US 2002/0074115 A1 Jun. 20, 2002

(30) Foreign Application Priority Data

Oct. 11, 2000 (DE) .......................................... 100 50 125

(51) Int. Cl.[7] .............................................. G02B 7/02
(52) U.S. Cl. ...................................................... 359/820
(58) Field of Search ........................... 359/820; 165/86, 165/104.28

(56) References Cited

U.S. PATENT DOCUMENTS

| 3,836,236 A | 9/1974 | Kirk et al. | |
|---|---|---|---|
| 4,832,475 A | 5/1989 | Daniels | |
| 5,220,171 A | 6/1993 | Hara et al. | ................ 250/443.1 |
| 5,313,333 A | 5/1994 | O'Brien et al. | ............. 359/820 |
| 5,413,167 A | 5/1995 | Hara et al. | ..................... 165/86 |
| 6,198,579 B1 | 3/2001 | Rupp | |
| 6,466,382 B2 | 10/2002 | Muller-Rissmann et al. | |
| 6,521,877 B1 | 2/2003 | Muller-Rissmann et al. | |
| 6,522,392 B1 | 2/2003 | Muller-Rissmann et al. | |
| 2003/0168203 A1 * | 9/2003 | Gektin et al. | ............... 165/80.3 |

FOREIGN PATENT DOCUMENTS

| DE | 40 07 622 A1 | 9/1991 |
|---|---|---|
| DE | 93 21 453 U1 | 6/1998 |
| JP | 8-313818 | 11/1996 |

\* cited by examiner

*Primary Examiner*—Ricky Mack
(74) *Attorney, Agent, or Firm*—Wells St. John P.S.

(57) ABSTRACT

In a temperature compensation apparatus for thermally loaded bodies made from materials of low specific thermal conductivity, a heat-distributing device having one or more heat-distributing bodies is adapted to surfaces of the thermally loaded body such that there remains between the thermally loaded body and the heat-distributing bodies a gap which is filled with a fluid for the purpose of the thermal coupling of thermally loaded bodies and heat-distributing bodies in conjunction with mechanical decoupling.

27 Claims, 4 Drawing Sheets

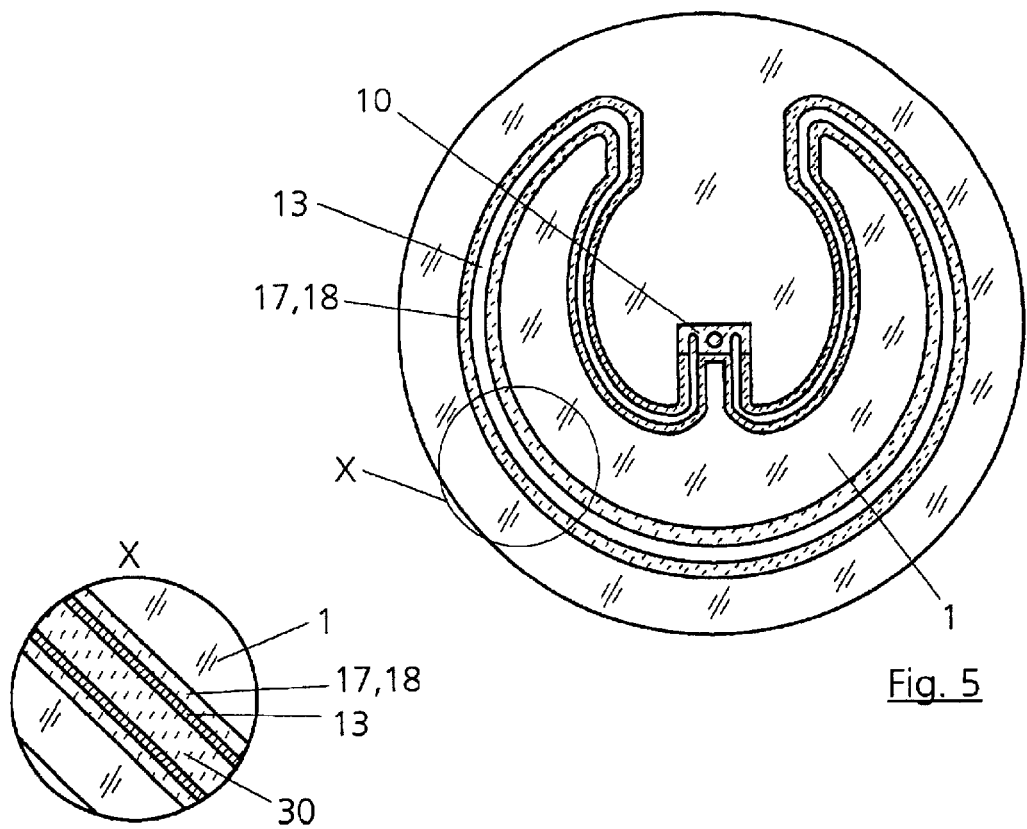
Fig. 5
Fig. 6
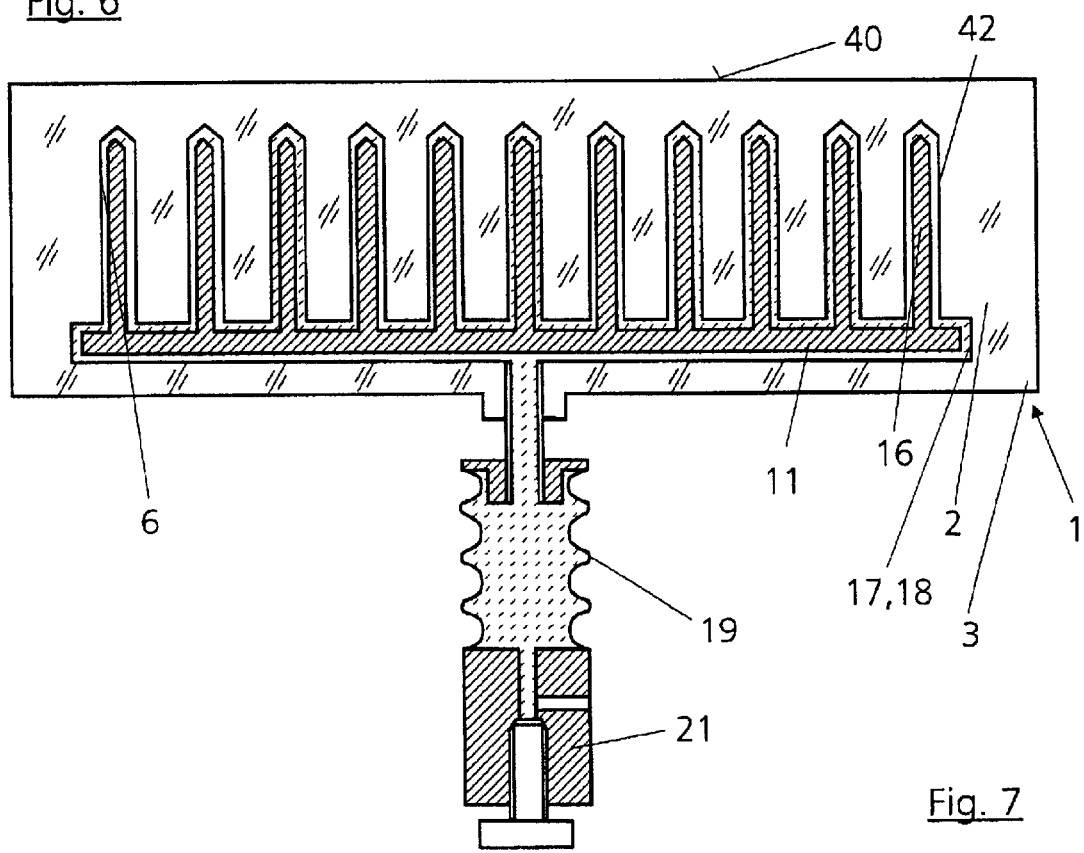
Fig. 7

TEMPERATURE COMPENSATION APPARATUS FOR THERMALLY LOADED BODIES OF LOW THERMAL CONDUCTIVITY

RELATED APPLICATIONS

This application relates to and claims priority to corresponding German Patent Application No. 100 50 125.7 filed on Oct. 11, 2000.

BACKGROUND OF THE INVENTION

The invention relates to an apparatus for compensating temperature differences in thermally loaded bodies of low thermal conductivity. The invention relates also to apparatuses for mirror supports which are used in projection lenses for micro lithography.

Heat-distributing apparatuses are generally known in micro lithography. Thus, for example, U.S. Pat. No. 5,220,171 and U.S. Pat. No. 5,413,167 describe heat-distributing apparatus for cooling wafers by using a liquid guided in channels as heat-transporting medium.

U.S. Pat. No. 5,313,333 relates to devices for compensating temperature deviations in an optical assembly.

Japanese publication JP 83 13 818 discloses a mirror with a cover plate, which has a reflecting layer, and a lower plate which is arranged therebelow and is situated at a spacing therefrom, the two parts being connected to one another by webs and chambers situated therebetween.

A mirror support in a projection lens for micro lithography is heated by absorbed useful radiant energy. This results in two temperature problems which are to be distinguished from one another:

One problem consists in an excessively large increase of the mean substrate temperature. This can lead to variations in the micro-structure of substrate and layer materials, which disadvantageously affect the properties of the optical surface.

The other problem resides in an inhomogeneous temperature distribution inside the mirror substrate. Because of the thermal expansion, an inhomogeneous temperature distribution results in an expansion distribution which is approximately analogous thereto and deforms the mirror substrate and thus the optical surface.

A solution should be found for both thermal problems, but for that of the inhomogeneous temperature distribution, in particular. The problem of the inhomogeneous temperature distribution will be explained in more detail below to promote better understanding of the particular mode of operation:

The inhomogeneous temperature distribution inside the substrate essentially has the two following causes:

Whereas the heat input takes place virtually exclusively via the optical surface, the output of heat is accomplished chiefly by emission at the edge and rear of the mirror, and partially by thermal conduction via the mount. Since the points of heat input are therefore situated elsewhere than those of heat output, temperature gradients are formed because of the thermal resistance of the substrate material.

The second cause is the illumination, generally inhomogeneous, of the optical surface, because firstly the radiation region does not occupy the entire optical surface, and secondly the circuit pattern projected with the aid of the projection optics causes an inhomogeneous intensity distribution inside the radiation region. Strongly irradiated regions of the optical surface then warm up more strongly than weakly irradiated ones. If it is desired to solve the problem of the substrate deformation caused by an inhomogenous temperature distribution, it is obvious to use a substrate material whose coefficient of thermal expansion is very low. This approach is often adopted in precision optics by selecting substrate materials such as quartz, Zerodur or ULE, and leads to a substrate deformation which is sufficiently low for many applications. However, a disadvantage of the said materials is the thermal conductivity, which is much lower by comparison with metallic materials and leads to comparatively large temperature differences inside the thermally loaded mirror support and partially cancels out again the deformation-reducing effect of the low coefficient of thermal expansion. This fact has a very disadvantageous effect particularly in the case of mirror supports in micro lithography lenses for the 13 nm technology (EUVL), since because of the high degree of absorption of an individual optical surface of approximately 40% in the 13 nm band, the heat flux in the mirror support becomes very large and large temperature differences thereby occur in the substrate. At the same time, the requirements placed on the accuracy of the surface shape in a mirror system such as is represented by an EUVL lens are substantially more stringent than in the case of lens optics such as are chiefly used at present in micro lithography.

It is therefore the object of the present invention to create an apparatus by means of which the heat distribution in the thermally loaded body can be improved without the risk of thermal deformations and without simultaneously worsening the low coefficient of thermal expansion.

SUMMARY OF THE INVENTION

This object is achieved according to a heat-distributing device having one or more heat-distributing bodies adapted to surfaces of the thermally loaded body such that there remains between the thermally loaded body and the heat-distributing bodies a gap which is filled with a fluid for the purpose of the thermal coupling of thermally loaded bodies and heat-distributing bodies in conjunction with mechanical decoupling.

According to the invention, a separation now takes place between a mechanical coupling and a thermal coupling with reference to the thermally loaded body. A coupling fluid is introduced in an appropriately created gap or in an intermediate gap between the heat-distributing device, which distributes heat and dissipates heat and is, for example, embedded in the thermally loaded body or arranged thereon, and the thermally loaded body. The coupling fluid ensures thermal coupling to the heat-distributing device, but simultaneously decouples the latter mechanically from the thermally loaded body. In this way, deformations of the heat-distributing device are not transmitted onto the thermally loaded body, for example a mirror substrate or a mirror support.

In this case, a solid body made from a material of high specific thermal conductivity such as, for example, Cu, Al, Ag etc. can be used as heat-distributing body. Another embodiment of a heat-distributing body consists of a thin-walled solid body penetrated by capillaries, for example a tube, through whose capillaries a second fluid flows. Here, the heat distribution takes place through the entrainment of the heat with the flowing fluid.

The coupling fluid, which fills the gap between the substrate, that is to say the thermally loaded body, and the heat-distributing body, can be a liquid, a gas or else a material of sufficiently low viscosity. Preference is given to liquids of good thermal conductivity such as, for example, water, mercury or metal alloys which are liquid at room temperature.

In order to rule out a deforming influence of the pressure of the coupling fluid on the thermally loaded body, the heat-distributing device can include a device for pressure compensation between the coupling fluid and the external surroundings of the thermally loaded body. The device can be designed in the form of an ascending pipe or an elastic vessel, for example a metal diaphragm bellows. Preference is given to the design having an elastic vessel formed from a metal diaphragm bellows, since this renders it possible to seal the coupling fluid with reference to the surroundings of the substrate, and thus to prevent the coupling fluid from running out or outgassing.

The coupling fluid, which fills the gap between the thermally loaded body and the heat-distributing body, executes no movement, that is to say does not flow. This rules out pressure differences inside the gap volume on the basis of flow pressure drops.

The apparatus according to the invention ensures a substantial reduction in the temperature difference inside the thermally loaded body, and thus ensures a reduction in the thermally induced deformations of the optical surface, the high degree of mechanical decoupling in the heat-distributing device and the thermally loaded body taking account, in particular, of the high requirements placed by micro lithography on the dimensional stability of the optical surfaces.

In a preferred development of the invention, the heat-distributing device is connected to one or more temperature controllers. It is possible with this development to reduce and stabilize the mean temperature of the thermally loaded body. It is possible, for example, to use as temperature controllers Peltier elements whose cooling side is directly connected to the heat-distributing body of the heat-distributing device, and whose warmer side outputs the heat absorbed by the thermally loaded body, and the lost energy occurring during operation of the Peltier element, doing so by thermal radiation. In another embodiment, the heat-distributing body is flowed through by a cooling liquid which is guided out of the heat-distributing body and is cooled by a temperature controller situated outside the heat-distributing device.

BRIEF DESCRIPTION OF THE DRAWINGS

Further advantageous developments and refinements of the invention follow from the subclaims and from the following exemplary embodiments described in principle with the aid of the drawing, in which:

FIG. 5 shows a section along the line V—V in FIG. 4;

FIG. 6 shows an enlarged illustration of the detail X in FIG. 5;

FIG. 7 shows a section through an embodiment in the case of which the heat-distributing body is provided with a multiplicity of fingers which are good thermal conductors and reach through bores up to near the optical surface;

DETAILED DESCRIPTION OF THE PREFERRED EMBODIMENT

Figure 1:
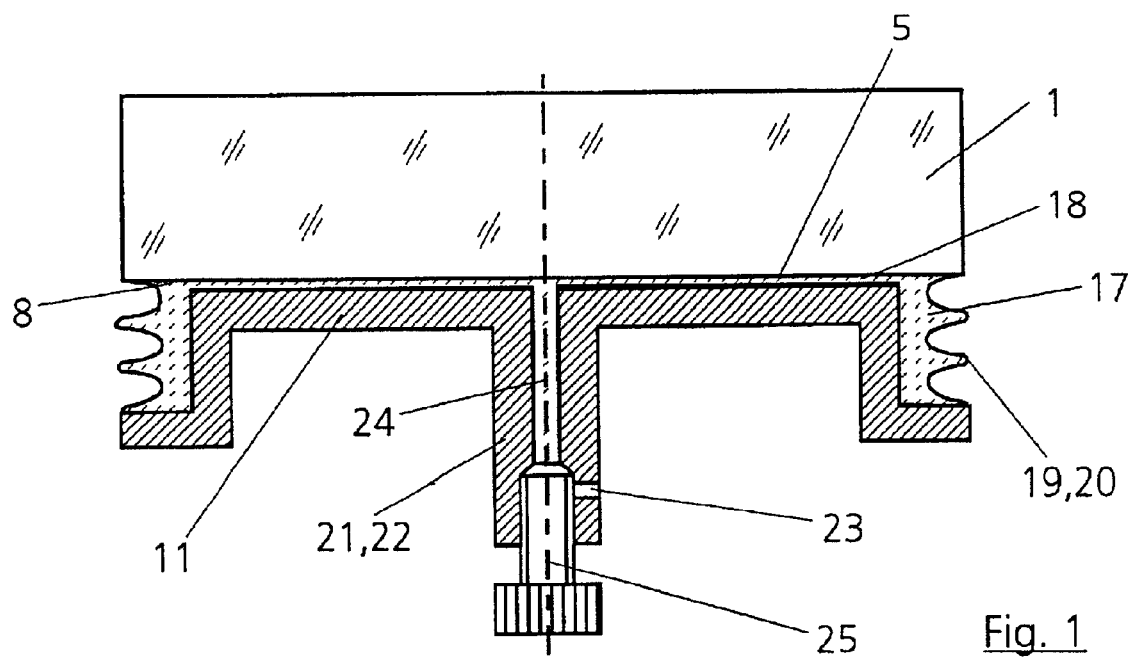
FIG. 1 shows a section through an embodiment in the case of which the heat-distributing body of the heat-distributing device is adapted to an exterior side of the thermally loaded body.

FIG. 1 shows an apparatus having a heat-distributing device which is adapted to an outer surface 5 of a thermally loaded body 1. The heat-distributing device comprises a heat-distributing body 11, a coupling fluid 17, a pressure compensation device 19 and a filling device 21. The heat-distributing body 11 is designed as a solid body made from a material of high specific thermal conductivity such as, for example, Cu, Al, Ag, $Al_2O_3$ or SiC, and is configured and arranged such that a narrow gap 18 which is filled with the coupling fluid 17 remains between the thermally loaded body 1 and the heat-distributing body 11. The fluid, for example He or another inert gas, $H_2O$, Hg or a metal alloy which is liquid at room temperature, ensures good heat transfer between the outer surface of the thermally loaded body and the heat-distributing body, while it simultaneously prevents the transmission of deformations of the heat-distributing body on to the thermally loaded body.

The pressure compensation device 19 is designed as a metal diaphragm bellows 20 which simultaneously forms the boundary of the thermal coupling surface, and connects the thermally loaded body 1 and the heat-distributing body 11 to one another. The pressure compensation device 19 ensures pressure compensation between the external surroundings 9 and the coupling fluid 17 such that virtually the same bearing pressure acts on all surfaces of the thermally loaded body. Furthermore, the pressure compensation device 19 prevents a variation in the pressure of the coupling fluid 17 in the event of changes in shape of the heat-distributing body 11. The metal diaphragm bellows 20 additionally seals the coupling fluid 17 against the external surroundings 9, and serves as fastening element of low stiffness with which the heat-distributing device is fastened to the thermally loaded body 1.

The heat-distributing device is provided with a filling device 21 fitted on the heat-distributing body 11, in order to fill the gap 18 with the coupling fluid 17. The filling device 21 has the function of a sealable connection between the gap volume and the external surroundings 9. The filling device comprises a housing 22, which is equipped with a filling opening or inlet opening 23 to the outside and a connecting channel 24 to the gap 18, and a valve screw 25.

Figure 2:
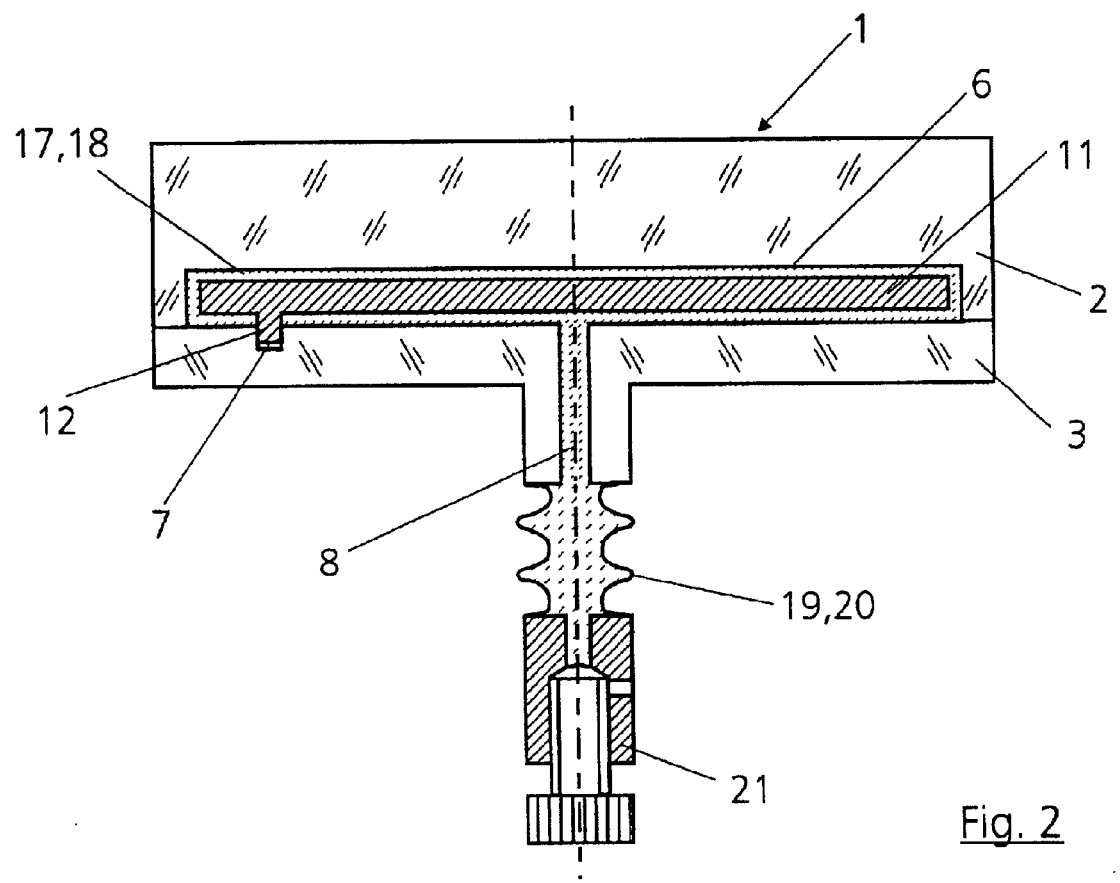
FIG. 2 shows a section through an embodiment in the case of which the heat-distributing body is embedded in the thermally loaded body.

FIG. 2 shows an apparatus having a heat-distributing device, in the case of which the heat-distributing body 11 is adapted to an inner surface 6 of the thermally loaded body 1. The thermally loaded body 1 comprises two parts, an upper part 2 and a lower part 3, these being configured such that a volume located inside the thermally loaded body 1 is present after the assembly of the upper and lower parts. Before the upper and lower parts 2 and 3 are connected to one another, for example by bonding, the heat-distributing body 11 is inserted into the inner volume produced. After the assembly, a connection exists between the inner volume and external surroundings 9 only via a volume compensation channel 8, otherwise the inner volume is sealed off from the external surroundings 9 by the joining surface between the upper and lower part 2 and 3.

As in the design according to FIG. 1, the heat-distributing device is built up from a heat-distributing body 11, a coupling fluid 17, an pressure compensation device 19 and a filling device 21. The heat-distributing body 11 is designed as a solid body made from a material of high specific thermal conductivity and configured and arranged such that there remains between the thermally loaded body and heat-distributing body a narrow gap 18 which is filled with a coupling fluid 17 for the purpose of thermal coupling between the thermally loaded body and heat-distributing body 11. In order to fill the gap volume with the coupling fluid 17 and to compensate changes in the volume of the gap 18 filled with the coupling fluid 17, the volume compensation channel 8 leads from the inner volume into the pressure compensation device 19, which is formed by the metal diaphragm bellows 20 and is connected to the lower part 3 of the thermally loaded body 1. The filling device 21 for filling the system with the coupling fluid 17 is connected to the pressure compensation device 19.

Since the heat-distributing body 11 bears with the force of its weight against the lower part 3 of the thermally loaded body 1, it is advantageous to create stationary bearing points such that the deformation state, caused by the bearing forces, of the thermally loaded body 1 remains unchanged. The heat-distributing body 11 can be provided for this purpose with three support pins 12 which reach into the centring bores 7 of the lower part 3 of the thermally loaded body 1. This results in a statically determined bearing of the heat-distributing body 11 which is secure against rotations and displacements.

Figure 3:
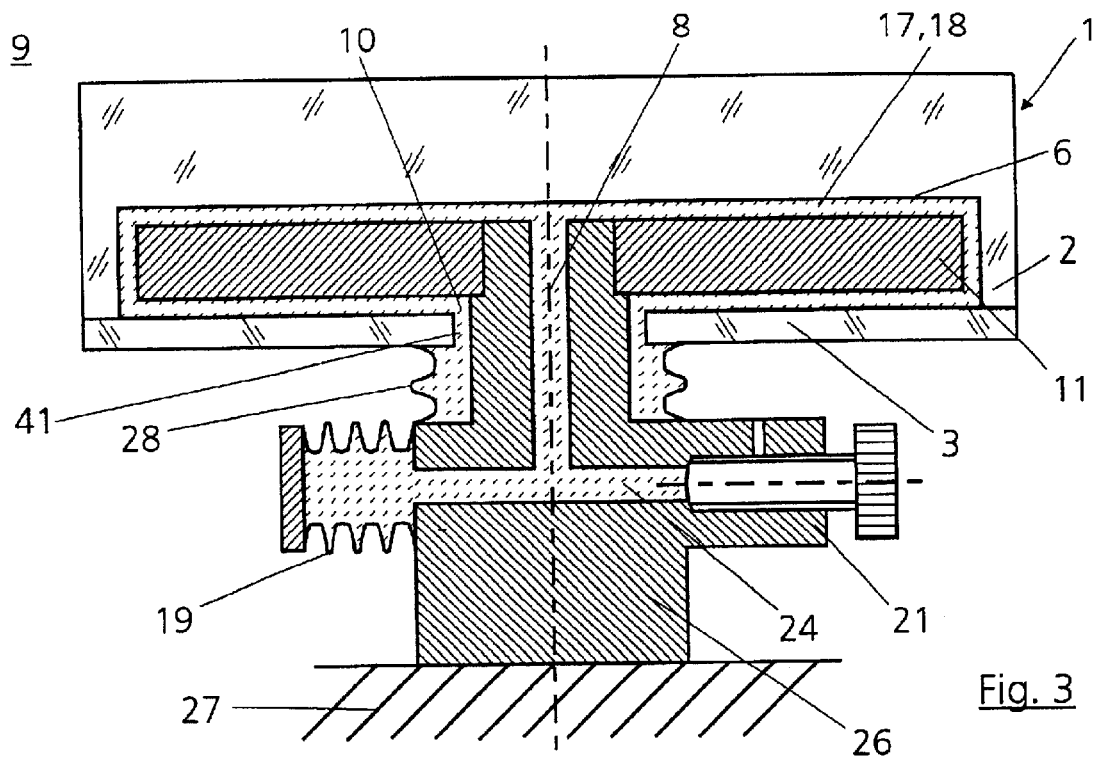
FIG. 3 shows a section through an embodiment in the case of which the heat-distributing body is embedded in the thermally loaded body and is held by a bearing structure situated on the outside.

FIG. 3 shows an apparatus having a heat-distributing device corresponding to the design according to FIG. 2, with the difference that instead of bearing on the lower part 3 of the thermally loaded body 1 the heat-distributing body 11 is connected via a supporting body 26, likewise belonging to the heat-distributing device, to an external bearing structure 27, and is therefore held largely independently of the thermally loaded body 1. By contrast with the design according to FIG. 2, the pressure compensation device 19 is adapted to the supporting body 26 and connected with a fluid-filled gap 18 via a volume compensation channel 8 leading through the supporting body.

By contrast with the design according to FIG. 2, the filling device 21 is likewise adapted to the supporting body 26 and connected to the gap 18 via the filling channel, leading through the supporting body 26, or connecting channel 24. The supporting body 26 projects outward through an opening 10 in the lower part 3 of the thermally loaded body 1 into the inner volume of the thermally loaded body, and is connected permanently there to the heat-distributing body 11.

There is no direct connection between the thermally loaded body 1 and the supporting body 26, rather both parts are separated from one another by a fluid-filled gap 41. The fluid located in the gap volume is sealed off from the external surroundings 9 with the aid of a sealing elastic element 28 of low stiffness, for example a metal diaphragm bellows, which is arranged between the lower part 3 of the thermally loaded body and the supporting body 26. The low stiffness of the sealing elastic element 28 renders the forces transmitted via this element in the case of relative movements between the supporting body 26 and thermally loaded body 1 so small that no appreciable deformation of the optical surface is caused thereby.

Figure 4:
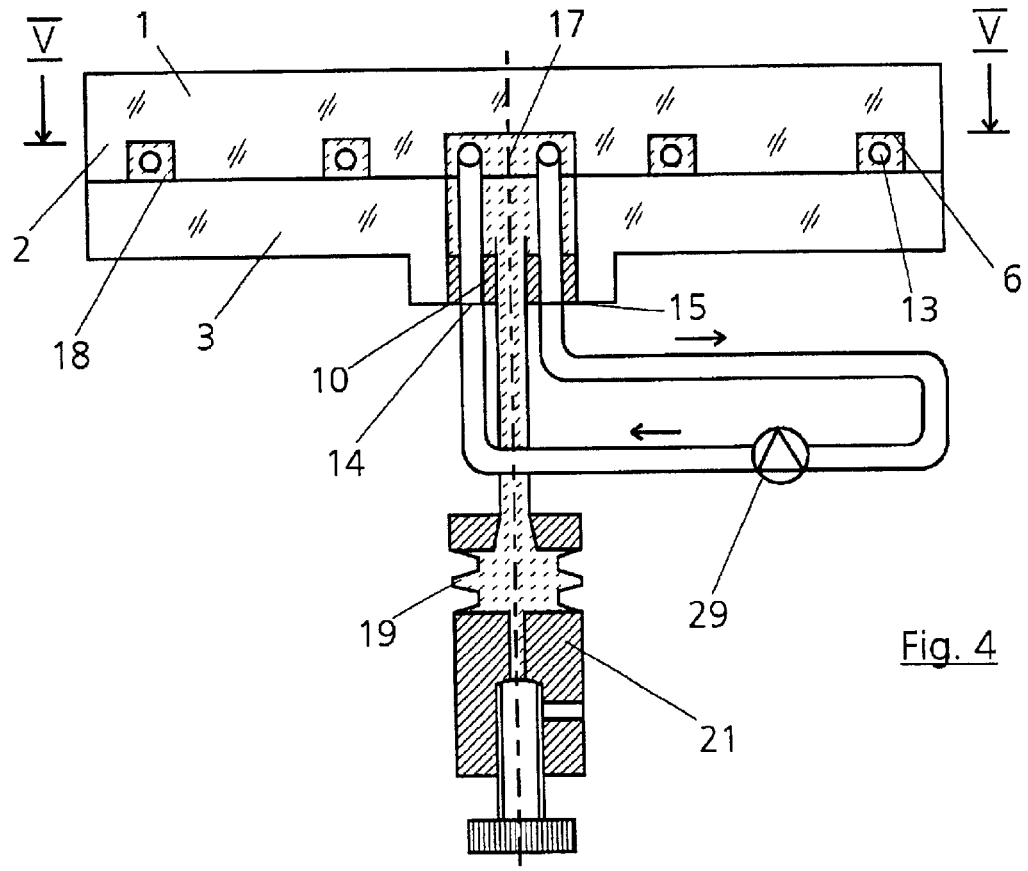
FIG. 4 shows a section through an embodiment in the case of which the heat-distributing body is formed from a tube structure through which a liquid flows.

FIGS. 4, 5 and 6 show an apparatus having a heat-distributing device corresponding to the design according to FIG. 2, with the difference that the heat-distributing body 11 is designed as a thin-walled hollow body 13, for example a tube, through which a second fluid 30 flows in order, by means of the material transport produced in this way through the heat-distributing body, also to transport the heat absorbed by the heat-distributing body 11 and thereby to distribute it uniformly. Likewise by contrast with the design according to FIG. 2, the heat-distributing body is led out of the inner volume of the thermally loaded body 1, in order to be able to connect a recirculating device 29 in the form of a media pump between an inlet opening 14, fitted on the heat-distributing body, and an outlet opening 15, likewise fitted on the heat-distributing body, for the flowing fluid 30, this recirculating device 29 being part of the heat-distributing device. The two fluids 17 and 30 of the heat-distributing device must be strictly distinguished, because while the first fluid 17 serves the transfer of heat between the thermally loaded body 1 and heat-distributing body 11 or 13, and has the same pressure everywhere, the second fluid 30 serves the purpose of distributing the heat inside the heat-distributing body and, because of the flow pressure drop, has spatially different pressures. The heat-distributing body is held via a permanent connection between the heat-distributing body and thermally loaded body 1 in the region of the opening 10 in the lower part of the thermally loaded body, from which the heat-distributing body is led out of the internal volume.

FIG. 7 shows an apparatus having a heat-distributing device corresponding to the design according to FIG. 2, with the difference that the heat-distributing body 11 is provided with a multiplicity of fingers 16 which are good thermal conductors and reach through corresponding bores 42 in the upper part 2 of the thermally loaded body 1 to near the optical surface 40. The design variant can, in particular, reduce temperature gradients which are aligned perpendicular to the optical surface and therefore run, as it were, from top to bottom.

Figure 8:
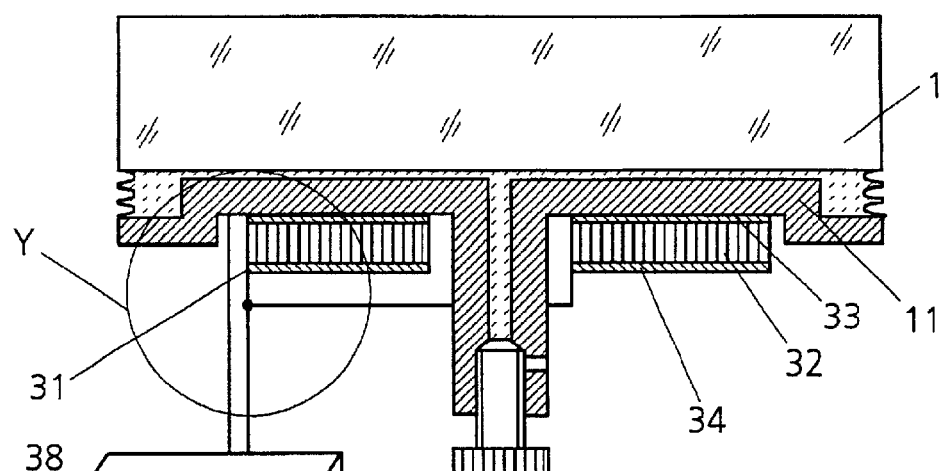
FIG. 8 shows a section through an embodiment in the case of which Peltier elements are adapted to the heat-distributing body as part of a temperature controller.
Figure 9:
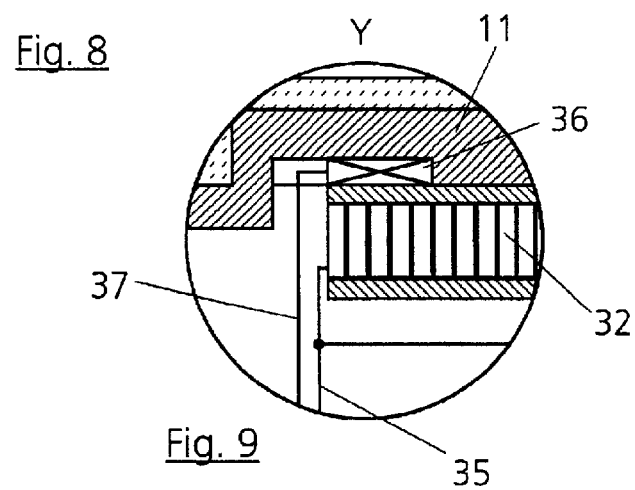
FIG. 9 shows an enlarged illustration of the detail Y in FIG. 8.

FIGS. 8 and 9 show a development of a heat-distributing device corresponding to the design according to FIG. 1. The heat-distributing device is additionally equipped in this case with a temperature controller 31 comprising one or more Peltier elements 32, a temperature sensor 36 and a temperature regulating unit 38. This development renders it possible to keep the mean temperature of the thermally loaded body 1 constant largely independently of the level of the useful radiant energy absorbed per time unit. Since stabilizing the temperature mostly requires heat to be led out of the thermally loaded body 1, the Peltier elements 32 are connected to the heat-distributing body 11 in a planar fashion with their cooler side 33, while the warmer side 34 remains free and is arranged such that the heat output by this surface can be output in the form of radiation to the ambient structural surroundings. The temperature sensor 36 is embedded in the heat-distributing body 11 for the purpose of determining temperature. Electric supply leads 35, 37 of the Peltier elements 32 and of the temperature sensor 36 lead to the temperature regulating unit 38 such that a closed control loop is produced.

Figure 10:
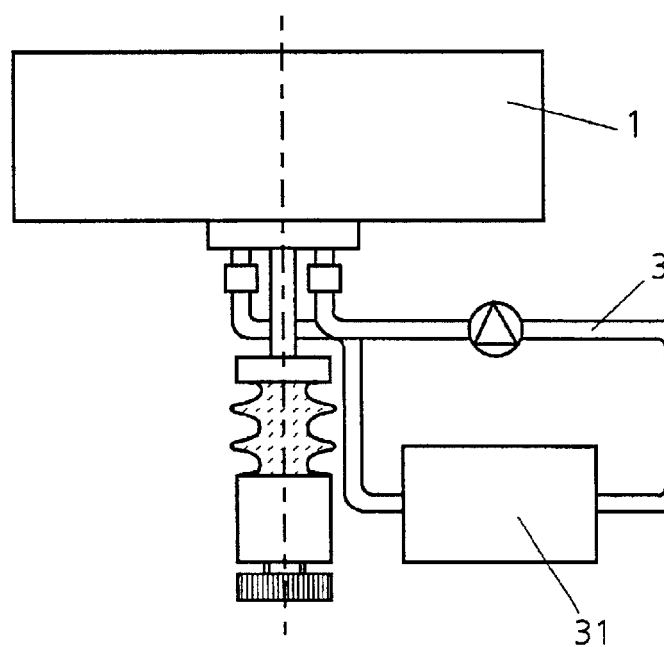
FIG. 10 shows a section through an embodiment in the case of which the heat-distributing body is flowed through by a fluid which is guided out of the heat-distributing device and subjected to temperature control in a temperature controller situated outside.

FIG. 10 shows an apparatus having a heat-distributing device corresponding to the design according to FIGS. 4, 5 and 6, a temperature controller 31 being inserted as a development into a circuit 39 of the flowing fluid 30 such that the temperature of the flowing fluid can be controlled by means of the temperature controller 31 independently of the useful radiant energy absorbed per time unit by the thermally loaded body 1.

What is claimed is:

1. Temperature compensation apparatus for thermally loaded bodies made from materials of a specific thermal conductivity, comprising:
   a heat-distributing device having one or more heat-distributing bodies; and
   a thermally loaded body, the heat-distributing device is adapted to surfaces of the thermally loaded body such that there remains between the thermally loaded body and the one or more heat-distributing bodies a gap which is filled with a fluid for the purpose of thermal coupling the thermally loaded body and the one or more heat-distributing bodies in conjunction with mechanical decoupling.

2. Temperature compensation apparatus as claimed in claim 1, wherein the fluid-filled gap is connected to a pressure-compensating device via a connection.

3. Temperature compensation apparatus as claimed in claim 1, wherein the one or more heat-distributing bodies are solid and are made from a material of high specific thermal conductivity comprising at least one material from a group of Cu, Al, Ag, $Al_2O_3$ or SiC, the specific thermal conductivity being at least ten times as high as that of the material of which the thermally loaded body substantially consists.

4. Temperature compensation apparatus as claimed in claim 1, wherein at least one of the one or more heat-distributing bodies is designed as a hollow body whose inner volume is filled with a fluid which executes a circulating flowing motion.

5. Temperature compensation apparatus as claimed in claim 1, wherein at least one of the one or more heat-distributing bodies is connected via a supporting body to an external bearing structure, and is held by the latter, while there is no connection, or an elastic connection between the thermally loaded body and the at least one of the one or more heat-distributing bodies, as well as between the thermally loaded body and the supporting body.

6. Temperature compensation apparatus as claimed in claim 1, wherein the one or more heat-distributing bodies are adapted to internal surfaces of the thermally loaded body.

7. Temperature compensation apparatus as claimed in claim 1, wherein the fluid-filled gap is connected to a sealable filling device via a connection (connecting channel).

8. Temperature compensation apparatus as claimed in claim 4, wherein for the purpose of generating the circulating flowing motion of the fluid, which fills the one or more heat-distributing bodies designed as a hollow body, a recirculating device is connected to inlet and outlet openings of the one or more heat-distributing bodies which are provided for this purpose.

9. Temperature compensation apparatus as claimed in claim 1, wherein at least one of the one or more heat-distributing bodies is connected to one or more heat exchange elements of a temperature controller.

10. Temperature compensation apparatus as claimed in claim 9, wherein the one or more heat exchange elements are formed by a Peltier element.

11. Temperature compensation apparatus as claimed in claim 8, wherein a temperature controller of the flowing fluid is inserted into the circuit of this fluid.

12. Temperature compensation apparatus as claimed in claim 1, wherein the thermally loaded body comprises a microlithographic projection exposure objective having at least one mirror support, and wherein the at least one mirror support is provided with the heat-distributing device.

13. Temperature compensation apparatus for reflecting layer supports or substrates in optics, comprising:
    a heat-distributing device having one or more heat-distributing bodies; and
    a substrate comprising a thermally loaded body, the heat-distributing device is adapted to surfaces of the thermally loaded body such that there remains between the thermally loaded body and the heat-distributing bodies a gap which is filled with a fluid for the purpose of thermal coupling of said thermally loaded body and said heat-distributing bodies in conjunction with mechanical decoupling.

14. Temperature compensation apparatus as claimed in claim 13, wherein the heat-distributing bodies are solid and are made from a material of high specific thermal conductivity comprising at least one material from a group of Cu, Al, Ag, $Al_2O_3$ or SiC, the specific thermal conductivity being at least ten times as high as that of the material of which the thermally loaded body substantially consists.

15. Temperature compensation apparatus as claimed in claim 13, wherein at least one of the one or more heat-distributing bodies is designed as a hollow body whose inner volume is filled with a fluid which executes a circulation.

16. Temperature compensation apparatus as claimed in claim 13, wherein at least one of the one or more heat-distributing bodies is connected via a supporting body to an external bearing structure, and is held by the latter, while there is no connection, or only a connection of very low stiffness between the thermally loaded body and the at least one of the one or more heat-distributing bodies, as well as between said thermally loaded body and said supporting body.

17. Temperature compensation apparatus as claimed in claim 13, wherein the one or more heat-distributing bodies are adapted to internal surfaces of the thermally loaded body.

18. Temperature compensation apparatus as claimed in claim 13, wherein the fluid-filled gap is connected to a sealable filling device via a connection.

19. Temperature compensation apparatus as claimed in claim 15, wherein for the purpose of generating the circulation of the fluid, which fills the one or more heat-distributing bodies designed as a hollow body, a recirculating device is connected to inlet and outlet openings of the one or more heat-distributing bodies which are provided for this purpose.

20. Temperature compensation apparatus as claimed in claim 13, wherein at least one of the one or more heat-distributing bodies is connected to one or more heat exchange elements of a temperature controller.

21. Temperature compensation apparatus as claimed in claim 20, wherein the one or more heat exchange elements are formed by a Peltier element.

22. Temperature compensation apparatus as claimed in claim 19, wherein a temperature controller of the flowing fluid is inserted into the circuit of this fluid.

23. Temperature compensation apparatus as claimed in claim 13, wherein the substrate comprises an optical substrate with a surface, and wherein at least one of the one or more heat-distributing bodies is provided with a multiplicity of finger-type projections which are good thermal conductors and are aligned at least approximately perpendicular to the optical surface as antecedent basis.

24. Temperature compensation apparatus as claimed in claim 23, wherein the projections reach up to near the optical surface.

25. Temperature compensation apparatus as claimed in claim 13, wherein the fluid-filled gap is connected to a pressure-compensating device via a connection.

26. The Temperature compensation apparatus as claimed in claim 25, wherein the fluid-filled gap is connected to the pressure-compensating device via a volume-compensating channel.

27. Temperature compensation apparatus as claimed in claim 13, wherein the thermally loaded body comprises a microlithographic projection exposure objective having at least one mirror support, and wherein the at least one mirror support is provided with the heat-distributing device.

* * * * *